June 30, 1970 J. R. BATHRICK, JR., ET AL 3,518,493

ARRANGEMENT FOR MOUNTING AND CONNECTING MICROELECTRONIC CIRCUITS

Filed Nov. 28, 1967

INVENTORS:

JOHN R. BATHRICK, JR.

FRED A. GEORGE,

RODMAN A. MOGLE,

BY Norman C. Fulmer

THEIR ATTORNEY.

United States Patent Office 3,518,493

Patented June 30, 1970

3,518,493
ARRANGEMENT FOR MOUNTING AND CONNECTING MICROELECTRONIC CIRCUITS

John R. Bathrick, Jr., and Fred A. George, Whitesboro, and Rodman A. Mogle, Chittenango, N.Y., assignors to General Electric Company, a corporation of New York Filed Nov. 28, 1967, Ser. No. 686,256
Int. Cl. H05k *7/20, 1/14*
U.S. Cl. 317—100 4 Claims

ABSTRACT OF THE DISCLOSURE

An improved arrangement is disclosed for mounting a plurality of microelectronic circuits in a compact arrangement which dissipates heat and provides electrical connections and interconnections. The microelectronic circuits are positioned in thermal contact against the outer sides of a pair of mutually parallel elongated metal support strips, and electrical connectors extending from these circuits are connected to printed circuit boards respectively extending along the top and bottom edges of the parallel support strips. A connector unit, positioned between the parallel support strips, carries connectors which extend between the top and bottom circuit boards to provide interconnections where desired and which also function as receptacles for connector pins of an external electrical connector plug.

Background of the invention

Microelectronic circuits (also called microcircuits or integrated circuits) contain one or more circuit elements, or partial or complete electrical circuits, in a small unitary assembly. A representative size of such a unit is, for example, approximately one-fourth of an inch square by one-sixteenth of an inch thick, with a dozen or more connector leads or wires extending therefrom. In certain applications, computers for example, large numbers (hundreds or thousands) of microcircuits can be utilized. To take full advantage of their small size, it is desired to arrange these microcircuits into a small total volume. This entails a problem of heat transfer, because, although each microcircuit generates very little heat, a large number of them generate a total heat of sufficient magnitude that it must be removed. There also is a problem of arranging the numerous required electrical interconnections and external connections in a compact manner.

One way of mounting microcircuits is to place them on one or both sides of a circuit board. This generally must be a multilayer circuit board, and hence complicated and expensive, in order to provide the required numerous interconnections among the microcircuits. Furthermore, it is complicated and expensive to provide heat-dissipating conductors for the microcircuits on a circuit board. Another way of mounting microcircuits is to stack them, arranging the required interconnections in the space around them and interposing heat dissipating fins between the stacked microcircuits. However it is sometimes difficult to design such an arrangement so as to suitably locate both the heat dissipating fins and the electrical connections in the limited space available, and also is difficult and time-consuming to assemble and mechanically support such a three-dimensional construction. After being assemblied, it is difficult to replace any defective microcircuits. Air-blown cooling may be employed for the prior-art arrangements, but this requires the arrangement of suitable spaces for air flow, thus limiting design layout possibilities, and involves the expense, space, and maintenance problems of an air blower unit.

Summary of the invention

The principal objects of the invention are to provide an improved arrangement for mounting and connecting microcircuits and to solve the prior-art problems described above.

The improved assembly of the invention comprises, briefly and in a preferred embodiment, a plurality of microcircuits arranged in a row alongside and in thermal contact with an elongated heat conductor. Top and bottom circuit boards respectively extend along the top and bottom edges of the heat conductor, and connector leads of the microcircuits are attached to these circuit boards. Interonnections extend, transversely of the elongated heat conductor, between the top and bottom circuit boards. The heat conductor serves as the support for the assembly, and, preferably, the ends of this heat conductor extend beyond the microcircuit and circuit board arrangements and are provided with attachment means such as screw holes, for attaching the completed assembly to, and in thermal contact with, a frame or heat sink. Preferably, the assembly comprises a pair of the aforesaid elongated heat conductors, which also function as support strips, in mutually parallel spaced apart relationship, the microcircuits being positioned against the outer sides thereof and the connection leads thereof extending to the top and bottom circuit boards, which overlie the tops and bottoms of the parallel heat conductors. A connection unit, positioned between the parallel heat conductors, carries connectors which extend between the top and bottom circuit boards and provide interconnections therebetween. Preferably, these latter connectors are hollow metal sleeves adapted also to receive connector pins of an external electrical connector plug. These sleeves are provided with offset tabs for connection to one of the circuit boards, and the circuit board is provided with openings in alignment with the sleeves so that the external connector pins can be inserted through these openings and into the sleeves for making electrical connections.

Description of the preferred embodiment

Figure 1:
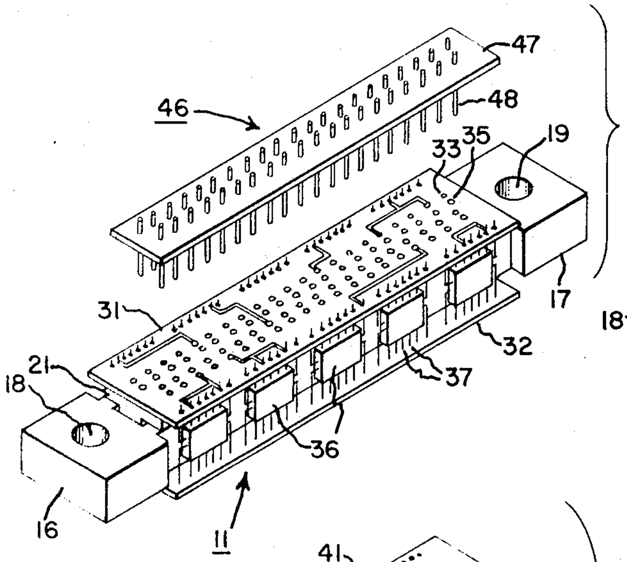
FIG. 1 is a perspective view of a microcircuit assembly, and connector plug therefor, in accordance with a preferred embodiment of the invention.
Figure 3:
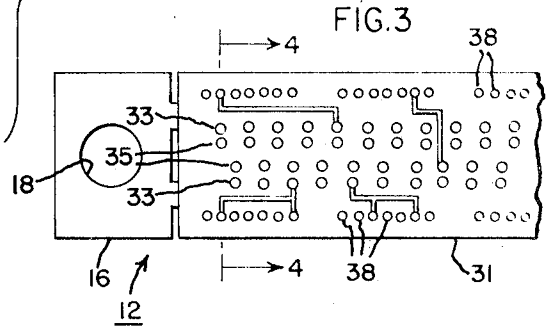
FIG. 3 is a top view of a portion of the assembly of FIG. 1.
Figure 2:
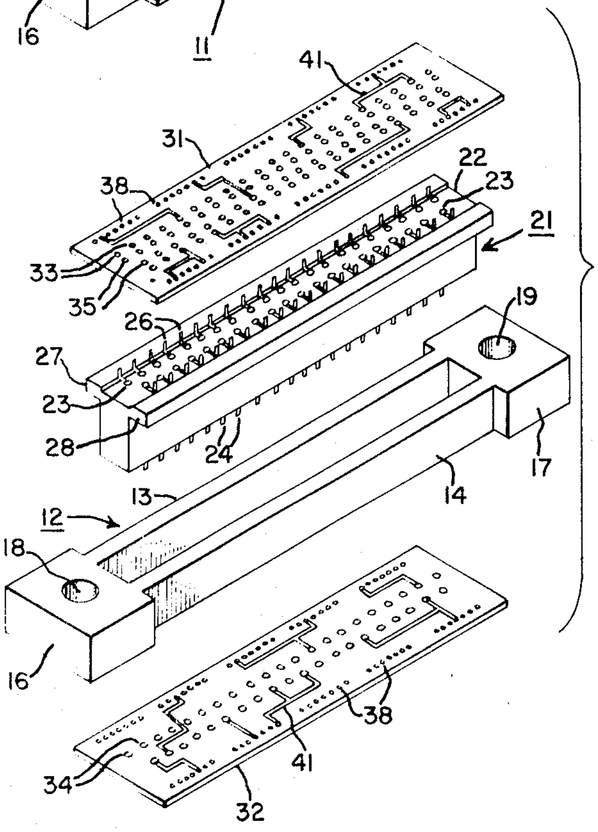
FIG. 2 is an exploded perspective view of a portion of the microcircuit assembly of FIG. 1.
Figure 4:
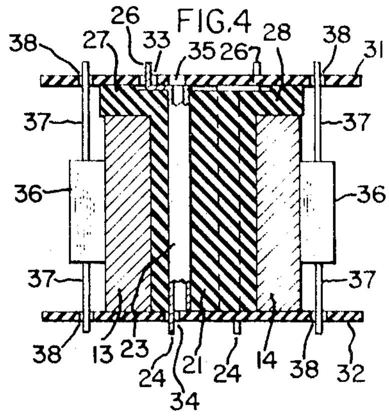
FIG. 4 is a cross-sectional view taken on the line 4—4 of FIG. 3.

The assembly of microcircuits shown in the drawing comprises a support member 12 consisting of a pair of elongated flat heat conducting support strips 13 and 14 arranged in mutually parallel spaced apart relationship and supported at their ends by a pair of heat-transfer mounting blocks 16 and 17 each provided with an opening 18, 19 for attachment to a support frame or chassis by means of screws. A connector unit 21 is positioned in the space between the heat conductive support strips 13 and 14, and consists of a body member 22 of plastic or other insulating material, provided with a plurality of connector sleeves 23 extending therethrough, from top to bottom of the support 12, each of the hollow sleeves 23 being provided with a connector tab 24 extending from the bottom thereof and an offset connector tab 26 extending from the top thereof. The body member 22 may be shaped to have outwardly extending flanges 27, 28 along the upper side thereof, to facilitate its positioning in the space between the support strips 13 and 14. The connector unit 21 may be cemented in place if desired.

Top and bottom circuit boards 31 and 32 are positioned over the top and bottom of the assembled support frame 12 and connector unit 21. The top circuit board 31 is provided with a plurality of openings 33 for respectively receiving the connector tabs 26 of the connector sleeves 23, and the bottom circuit board 32 is provided with a plurality of openings 34 for receiving the bottom connector tabs 24 of the connector sleeves 23. The top circuit board also is provided with a plurality of openings 35 in alignment with the connector sleeves 23, for the purpose of accommodating connector pins of an external connector plug as will be described.

Plurality of microcircuits 36, each provided with a plurality of connector leads 37 extending upwardly and downwardly therefrom, are positioned against the outer surfaces of the support strips 13 and 14, as shown, and their connector leads 37 extend into appropriate openings 38 provided in the top and bottom circuit boards 31 and 32. By suitably dimensioning the parts, the microcircuits 36 are easily installed, by first placing them so that their bottom leads extend all the way into the openings 38 of the bottom circuit board 32, and then moving them slightly upwardly so that their upper connector leads extend through the openings 38 of the top circuit board 31. To facilitate heat transfer, i.e. cooling, heat conducting cement or grease may be applied to the contact area between the microcircuits 36 and the heat conducting support strips 13 and 14.

The circuit boards 31 and 32 are provided with electrical connections thereon in well known manner, to provide desired electrical connections between the microcircuit lead openings 38 and the circuit interconnection openings 33 and 34. After assembly as described above, the connections between the circuit boards 31 and 32, and the microcircuit connector leads 37 and the interconnecting leads 23, may be secured by means of dip soldering or welding. If desired, the circuit boards 31 and 32 may be cemented to the top and bottom of the connector unit 21, although this is not necessary since the aforesaid dip soldering or welding step holds the circuit boards in place.

The aforesaid assembly provides a strong mechanical support for the microcircuits 36, and provides effective heat transfer, for cooling purposes, from the microcircuits, via the heat conducting support strips 13 and 14, to the end blocks 16 and 17, and to whatever frame or heat sink the end blocks 16, 17 are attached. In some situations, the end blocks 16 and 17 might suffice to provide adequate radiation into surrounding space, and if desired may be provided with fins to facilitate the heat radiation. The aforesaid assembly, in addition to providing secure mechanical mounting for the microcircuits and heat radiation therefrom, also provides multitudinous electrical interconnections, by means of the circuit boards 31 and 32 and the interconnector unit 21, among the various microcircuits 36.

An external connector plug 46 comprises an insulating body member 47 provided with plurality of connector pins 48 extending therefrom and adapted to enter through the openings 35 in the top circuit board 31 and enter into and in electrical contact with the connector sleeves 23. External circuit connections, not shown, are made to the exposed ends of the connector pins 48 on the plug 46. If desired, a plurality of connector plugs 46 may be attached to a "master" circuit board, onto which a plurality of the microcircuit assemblies 11 may then be attached.

Figure 5:
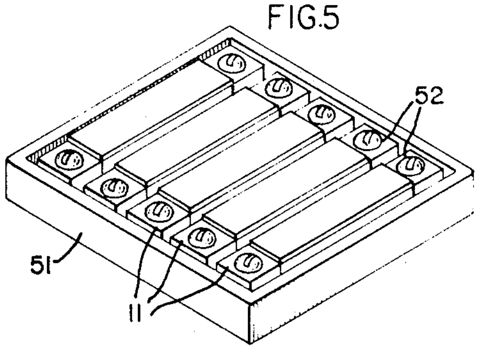
FIG. 5 is a perspective view of a plurality of the microcircuit assemblies, attached to a common support frame.

FIG. 5 shows an arrangement in which a plurality of the microcircuit assemblies 11 are attached to a metal heat-dissipating and support frame 51 by means of screws 52 through the attachment openings 18, 19 of the end block portions 16 and 17 of the support frames 12. A plurality of the connector plugs 46, not shown in FIG. 5, are positioned on, and may be dip-soldered to, a circuit board carried by the frame 51 beneath the microcircuit assemblies 11. When the microcircuit assemblies 11 are placed in the frame 51, they plug into the connector plugs 46, and application of the attachment screws 52 forces the connector sleeves of the microcircuit assemblies over the external connector pins 48 in addition to providing mechanical attachment and thermal connection of the assembly.

It will readily be realized that the disclosed construction accomplishes the objectives of the invention and solves the prior art problems described hereinbefore, thus achieving a practical and compact arrangement of a large plurality of microcircuits in a manner whereby the principal objectives are achieved of heat transfer, electrical interconnections and external connections, and also easy replaceability of any defective microcircuits, or replacement of microcircuits in order to up-date the assembly with new, improved, or different microcircuit units. Considerable circuit board design flexibility is achieved, since the various connector sleeves 23 may function as interconnections between the circuit boards and/or as external connections for one or both circuit boards.

While a preferred embodiment of the invention has been shown and described, various other embodiments and modifications thereof will be apparent to persons skilled in the art, and will fall within the scope of invention as defined in the following claims.

We claim:

1. An arrangement for mounting and connecting microcircuits, wherein the improvement comprises a pair of elongated heat conductive members in a mutually parallel spaced apart relationship forming a space therebetween, a plurality of microcircuits arranged in rows alongside and in thermal contact with the outer sides of said elongated heat conductive members, a pair of circuit boards respectively overlying the top and bottom edges of said elongated heat conductive members, said microcircuits being provided with connector leads extending upwardly and downwardly therefrom and into electrical contact with said circuit boards, and a connector unit positioned in said space formed between said elongated members and comprising a body of electrically insulating material carrying interconnectors in openings therethrough, said interconnectors extending from one to another of said circuit boards, said insulating body substantially filling the space between said elongated members and supporting at least one of said circuit boards, and said members functioning as a supporting means and heat transfer means for said arrangement.

2. An arrangement as claimed in claim 1 wherein said interconnectors comprise a hollow sleeve of electrically conducting material electrically connected at one end thereof to one of said circuit boards, the other end of said sleeve being provided with an offset connecting tab, the other of said circuit boards being provided with an opening for receiving said offset connecting tab for making electrical connection between said sleeve and said other circuit board, and said other circuit board being provided with an additional opening in alignment with said sleeve through which an external connector pin can be inserted and plugged into said sleeve, whereby said arrangement provides a circuit interconnection between said circuit boards and also provides for an external electrical connection to said arrangement.

3. An arrangement as claimed in claim 1, in which said interconnectors comprise hollow sleeves of electrically conductive material, and in which at least one of said circuit boards is provided with openings in alignment with said sleeves whereby external connector pins can be plugged through said one circuit board into said sleeves.

4. An arrangement as claimed in claim 3, in which at least one of said interconnector sleeves is provided with a connection tab at an end thereof offset from the sleeve wall, and in which at least one of the circuit boards is provided with an opening to receive said tab in addition to said opening in alignment with the sleeve.

References Cited

UNITED STATES PATENTS

| | | | |
|---|---|---|---|
| 3,202,869 | 8/1965 | Matson et al. | 317—100 |
| 3,239,719 | 3/1966 | Shower | 317—100 X |

| | | | |
|---|---|---|---|
| 3,304,468 | 2/1967 | Lawson | 317—101 |
| 3,348,101 | 10/1967 | Klein et al. | 317—100 |

LARAMIE E. ASKIN, Primary Examiner

G. P. TOLIN, Assistant Examiner

U.S. Cl. X.R.

339—17